United States Patent [19]

Fu

[11] Patent Number: 5,876,576
[45] Date of Patent: Mar. 2, 1999

[54] APPARATUS FOR SPUTTERING MAGNETIC TARGET MATERIALS

[75] Inventor: Jianming Fu, San Jose, Calif.

[73] Assignee: Applied Materials, Inc., Santa Clara, Calif.

[21] Appl. No.: 958,469

[22] Filed: Oct. 27, 1997

[51] Int. Cl.[6] .................................................. C23C 14/34
[52] U.S. Cl. .............................. 204/298.2; 204/298.19; 204/192.12
[58] Field of Search ........................... 204/192.2, 192.15, 204/192.12, 298.12, 298.13, 298.08, 298.2

[56] References Cited

U.S. PATENT DOCUMENTS

5,320,728  6/1994  Tepman ............................... 204/192.12
5,415,754  5/1995  Manley ................................ 204/192.12
5,685,959  11/1997  Bourez et al. ....................... 204/192.2

Primary Examiner—Nam Nguyen
Assistant Examiner—Gregg Cantelmo
Attorney, Agent, or Firm—Thomason and Moser

[57] ABSTRACT

Apparatus for sputtering magnetic target material using a magnetic field shunt within a moving magnet sputtering source. The apparatus includes a magnetic field shunt that is embedded into the target material along the path of the moving magnet assembly at a location where a deep erosion trench is created by the assembly in the target material. The magnetic field shunt provides an alternate path for the magnetic flux that is liberated by the erosion of the target. Alternatively, the magnetic field shunt is physically attached to the magnetic pole piece such that the magnetic shunt moves with the pole piece along the track that the pole piece is moved.

12 Claims, 6 Drawing Sheets

APPARATUS FOR SPUTTERING MAGNETIC TARGET MATERIALS

BACKGROUND OF THE DISCLOSURE

1. Field of the Invention

The invention relates generally to the field of magnetron sputtering and, more specifically, to planar magnetron sputtering apparatus for sputtering magnetic target materials using a rotating magnetic assembly.

2. Background of the Invention

Glow discharge sputtering is a well-known process that is widely used to deposit thin films of various kinds of ceramic and metallic materials onto the surfaces of objects. For example, glow discharge sputtering is commonly used in the electronics industry to produce integrated circuit semiconductors and photovoltaic cells, as well as the magnetic tapes and disks used in audio, video, and computer applications.

One type of glow discharge sputtering is diode sputtering. Diode sputtering is usually conducted in a vacuum chamber and in the presence of an inert sputtering gas, such as argon, that is maintained under very low pressure. The material to be sputtered (referred to as the target) is connected to the negative terminal of a DC power supply and serves as a cathode. The positive terminal of the power supply may be connected to a separate anode structure or to the vacuum chamber itself, depending on the application. The strong electric field between the target/cathode and the anode ionizes the sputtering gas, producing a glow discharge. Since the target/cathode is held at a strong negative potential, the positive ions from the glow discharge bombard the target material and eject target atoms, which then deposit on a workpiece or a substrate placed generally in line of sight of the target. Unfortunately, however, the diode sputtering process is slow and relatively inefficient compared to other film deposition techniques.

The efficiency of the diode sputtering process has been significantly increased by using a magnetic field to confine the glow discharge to the immediate vicinity of the target surface. Basically, while the sputtering yield (i.e., the number of target atoms dislodged or sputtered per incident ion) depends on the energies of the incident ions, the overall sputtering rate depends on both the energies of the incident ions as well as the total number of ions that bombard the target surface during a given time. Therefore, the sputtering rate can be increased by using a magnetic field to confine the ions and electrons produced in the glow discharge to the region immediately adjacent the surface of the target. The presence of such a plasma-confining magnetic field also has other benefits, such as allowing the sputtering operation to be conducted at lower gas pressures, confining the glow discharge to the neighborhood of the electrodes, and reducing electron bombardment of the substrates.

A common type of magnetic sputtering device is the planar magnetron, so named because the target is in the form of a flat circular or rectangular plate. Powerful magnets placed behind the target plate produce a strong plasma-confining magnetic field adjacent the front surface of the target, thus greatly increasing sputtering efficiency. While numerous shapes and configurations of plasma-confining magnetic fields exist, it is common to shape the plasma-confining magnetic field so that it forms a closed loop ring or "racetrack" over the surface of the target material. When viewed in cross-section, the flux lines of the magnetic field loop or arch over the surface-of the target, forming a magnetic "tunnel," which confines the glow discharge to a ring or racetrack shaped sputtering region proximate the front surface of the target. As is well-known, the electric field created by the high voltage between an anode and the target/cathode acting in combination with the closed loop magnetic field causes electrons within the glow discharge to gain a net velocity along the racetrack, with the magnitude and direction of the electron velocity vector being given by the vector cross product of the electric field vector $\overline{E}$ and the magnetic field vector $\overline{B}$ (known as the $\overline{E}\overline{XB}$ velocity). The shape of the predominate electron path defines the portion of the target material that will be sputtered.

While planar magnetrons are widely used to sputter non-magnetic target materials, such as aluminum and its alloys, they have not proven particularly useful for sputtering magnetic materials such as, for example, iron, nickel, iron-nickel alloys, and cobalt-chromium alloys. Simply replacing a non-magnetic target in a planar magnetron with a ferromagnetic target of the same general configuration usually causes most, if not all, of the magnetic field to be shunted through the magnetic target. This reduces the intensity of the plasma-confining magnetic tunnel above the target to the point where it can no longer effectively confine the plasma over the surface of the target, thus reducing planar magnetron sputtering to that of ordinary diode sputtering with its attendant relatively slow sputter rate and inefficiency.

One solution to the problem of sputtering magnetic target materials has been to use very thin targets so that the target does not short the entire magnetic field. If the target is thin enough (approximately 2–3 mm for a highly ferrous material), sufficient excess magnetic flux will remain over the front surface of the target to produce a plasma-confining magnetic tunnel. Unfortunately, however, such thin targets are rapidly depleted, thus requiring frequent replacement and substantial downtime of the sputtering apparatus.

Another solution to the problem has been to strengthen the magnetic field so that it can saturate thicker targets, yet still produce a plasma-confining magnetic tunnel over the front surface of the target. Usually a field strength in the range of about 80–100 gauss in a direction parallel to the target surface is required to achieve the magnetron effect. While stronger magnets are more expensive, they can, at least theoretically, result in a magnetron suitable for sputtering magnetic targets of sufficient thicknesses to offset the additional cost of the stronger magnets. Unfortunately, however, sputtering magnetrons that magnetically saturate the target suffer from another problem that has proven much more difficult to overcome: namely, severe magnetic pinching of the plasma.

Figure 1:
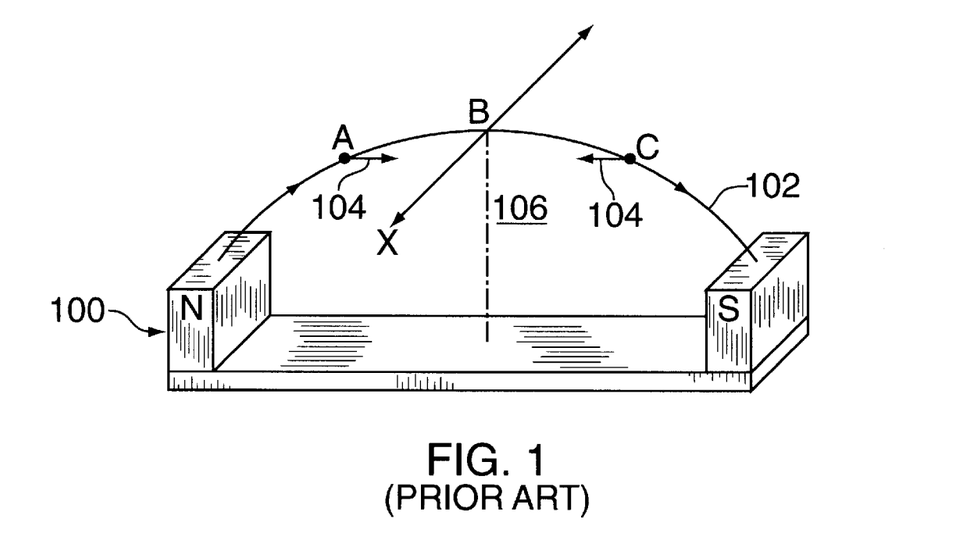
FIG. 1 is a schematic prospective view of a prior art sputtering magnetron qualitatively showing an arched magnetic flux line of the magnetic tunnel and the forces acting on electrons at various points along the magnetic flux line.

The magnetic pinching phenomenon is best understood by referring to FIG. 1 which illustrates, in schematic form, the forces acting on electrons in the region of the magnetic tunnel 106. In a prior art magnetron, a magnet assembly 100 produces a magnetic field that can be characterized by a plurality of magnetic flux lines 102 one of which is shown in FIG. 1. The flux line 102 shown in FIG. 1 is representative of the field shape immediately adjacent the front surface of the target. Points A and C are points in the central region of the tunnel, to the left and right of the central axis X respectively. Point B is a point on the central axis X of the tunnel, coincident with the flux line 102. The target locations within the tunnel fields are such that each of the points A, B, and C will be coincident with the front surface of the target at some time during the sputtering process. As is well-known, the curvature of the magnetic field 102 subjects electrons positioned at points A and C lateral forces (represented by arrows 104) that tend to push them toward the central axis X of the tunnel 106. Since the magnetic field has no vertical component (i.e., a component orthogonal to the plane of the pole piece) at point B, no lateral forces are exerted on electrons at point B. The action of the lateral forces on the electrons in the plasma tends to force or pinch them toward the central axis X of the magnetic tunnel 106. Since the erosion caused by sputtering is related to the density of the electrons in the glow discharge plasma, the effect of the pinching phenomenon increases the erosion rate along the central axis X of the magnetic tunnel 106.

Figure 2A:
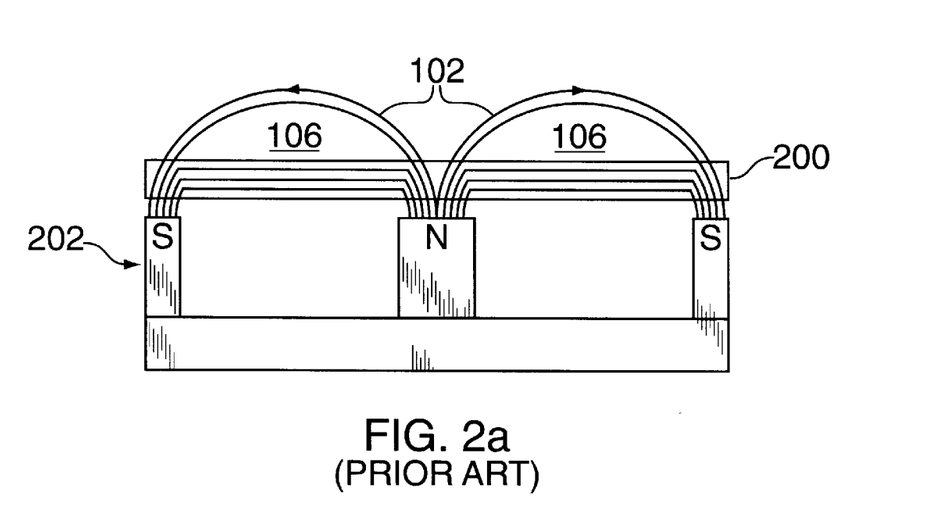
FIGS. 2(a)–2(d) are schematic cross-sectional views of a prior art sputtering magnetron for sputtering a magnetic target qualitatively showing the configuration of the magnetic tunnel and the erosion pattern resulting from the magnetic pinch phenomenon.
Figure 2B:
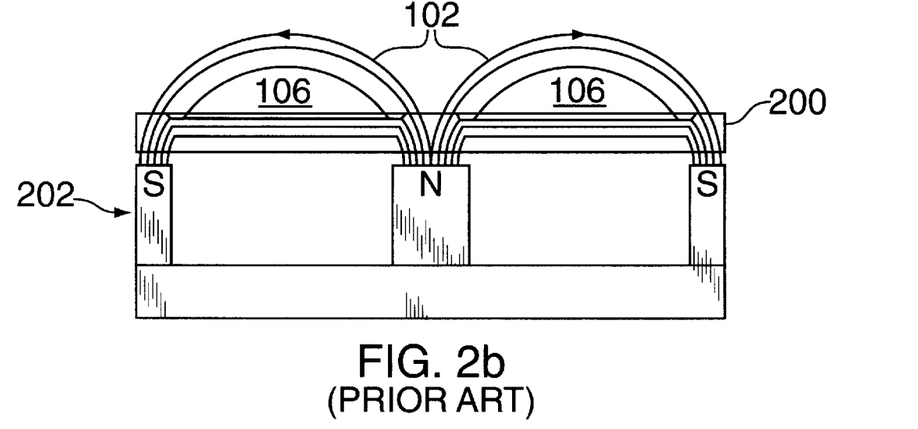
Figure 2C:
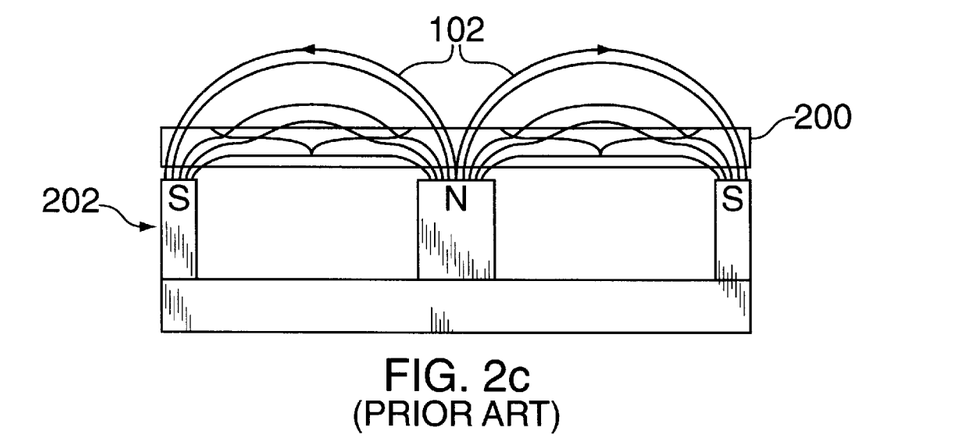
Figure 2D:
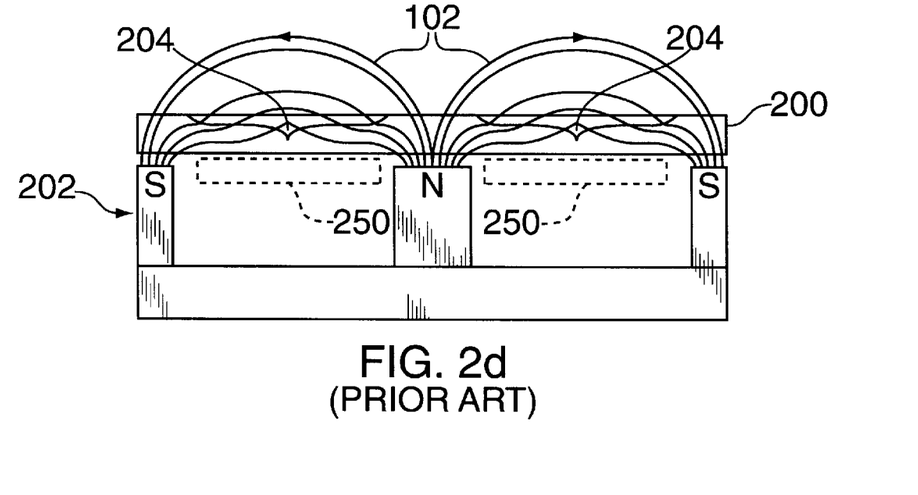

While this pinching phenomenon occurs in all types of planar magnetrons with arched magnetic tunnels, the problem becomes much worse when sputtering magnetic target materials, as best seen in FIGS. 2(a)–(d). When sputtering magnetic target 200, a large portion of the magnetic flux 102 produced by the magnet assembly 202 will be shunted through the magnetic target 200. However, if the magnetic field is strong enough, sufficient magnetic flux will remain over the front surface of the target to produce an arched, plasma-confining magnetic tunnel 106. As was explained above, the pinching forces resulting from the arched magnetic tunnel will initially pinch the electrons toward the center of the tunnel, resulting in the greatest erosion rate at a point disposed central to the tunnel. However, as the target erodes, its ross-sectional area decreases, thus forcing additional magnetic flux from the target. Since the excess magnetic flux always takes the lowest energy path (i.e., the path of least resistance), it usually exits the target surface in the erosion area and re-enters the target just as soon as the cross-sectional area has increased to the point where the target material can again accommodate the excess flux. The liberated magnetic flux arching over the front surface of the target subjects electrons within the glow discharge plasma to even greater pinching forces, which substantially increases the electron density, thus erosion rate, along the center of the tunnel, as best seen in FIG. 2(c). As the target erodes further, more and more magnetic flux is liberated, resulting in stronger pinching forces, higher electron densities, and greater erosion rates. The result is a deep, spike-like erosion groove 204 in the target 200, as best seen in FIG. 2(d).

The fraction of the target material that has been sputtered away by the time the bottom of the erosion groove 204 reaches the back surface of the target is referred to as the target utilization, and is extremely low for most magnetic targets, in the range of 5%–15% at best. Since most target materials tend to be relatively expensive, such low target utilization is wasteful and increases the costs associated with the sputtering process. For example, although spent targets may be recycled and re-worked into new targets, the time spent changing and reworking targets can be significant and in any event, increases the overall cost of the sputtering operation.

One solution to improving the pinching phenomenon when using non-moving, or static, magnets is disclosed in U.S. Pat. No. 5,415,754 which discloses a magnet assembly positioned adjacent to the back surface of a target for generating a magnetic field having sufficient strength to magnetically saturate the target and to produce a plasma-confining magnetic tunnel over the front surface of the target, i.e., similar to the assembly shown in FIGS. 2(a)–(d). A magnetic shunt (shown in phantom as 250 in FIG. 2(d)) is positioned a distance from the back surface of the target and provides an alternate path for most of the excess magnetic flux liberated by the erosion of the target. The alternate path is characterized by lower magnetic resistance than the paths which exist at the front surface of the target and paths through the sputtering region.

Although a static magnetic assembly having a magnetic shunt provides improved target utilization, such static magnetic assemblies are only useful for use with relatively small targets. A relatively small target is only capable of deposition upon small object and small semiconductor wafers (e.g., a 150 mm diameter wafer). Consequently, the target assembly disclosed in U.S. Pat. No. 5,415,754 is not useful for deposition upon large semiconductor wafers (e.g., 200 mm diameter wafers). Recent advances to efficiently deposit magnetic materials onto large objects such as 200 mm or greater diameter semiconductor wafers using large target structures utilize a moving (rotating) magnetic assembly. Such moving magnet assemblies are disclosed in U.S. Pat. Nos. 4,444,643; 4,714,536; and 5,320,728. Each of these patents discloses a movable magnetic field source that is moved along the back of a target, parallel to the face of the target to produce a time-averaged sputtering of the target such that the uniformity of target utilization is increased and that the target is more efficiently sputtered. A significant development in moving magnet target utilization control systems is disclosed in U.S. Pat. No. 5,320,728 which discloses a structure having shaped pole pieces and a specific motion path that best utilizes the target material. However, although the shape of the pole piece and the path over the target are both optimized to produce an efficient sputtering of the target material, the pole pieces move in a defined path that will result in the pinching phenomenon. Although the pinching phenomenon is averaged over the entire target structure as the magnets move in their defined patterns, over time the pinching phenomenon will result in the target being eroded to have specific tracks in the target material, leaving significant non-sputtered, and thus unused, portions of the target.

Therefore, there is a need in the art for apparatus that reduces the pinching phenomenon in a system that uses a moving magnetic field generator within a target assembly of a magnetic material sputtering system.

SUMMARY OF THE INVENTION

The disadvantages associated with the prior art are overcome by apparatus for sputtering magnetic target material using a magnetic field shunt within a moving magnet sputtering source. In the first embodiment of the invention, the magnetic field shunt is embedded into the target material along the path of the moving magnet. As such, if the moving magnetic pole pieces move in a circular pattern, the magnetic field shunt is an annular structure that is embedded into the target material. Specifically, the shunt is positioned where excessive-target erosion is expected, e.g., expected area of pinching phenomenon. The magnetic field shunt provides an alternate path for the magnetic flux that is liberated by the erosion of the target. The alternative path is characterized by the lower magnetic resistance than paths which exist through the front surface of the target and through the sputtering region.

In a second embodiment of the invention, the magnetic field shunt is physically attached to the magnetic pole pieces such that the magnetic shunt moves with the pole piece along the track that the pole piece is moved.

In a third embodiment of the invention, the inventive shunt is used with a laterally oriented magnetic pole piece.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 3:
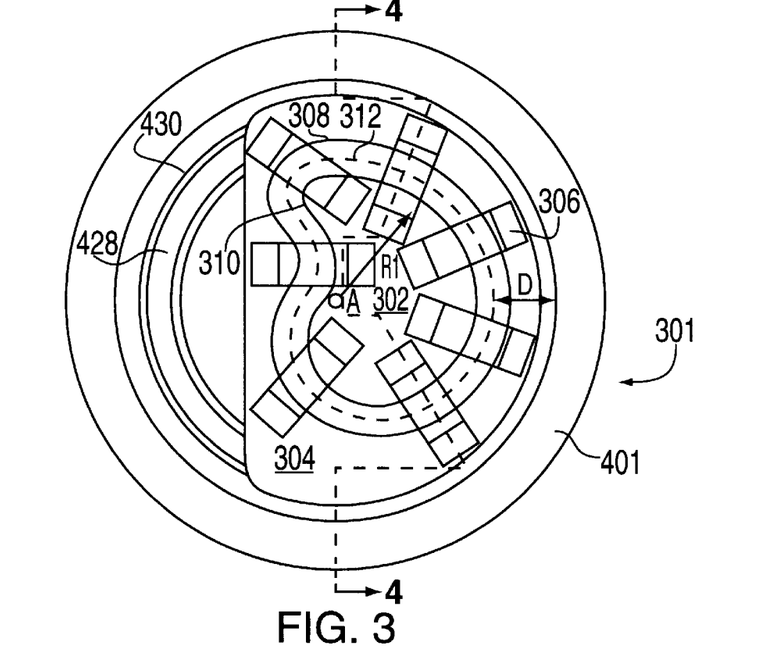
FIG. 3 is a schematic top cross-sectional view of the sputtering magnetic assembly according to the present invention taken along line 3—3 of FIG. 4.
Figure 4:
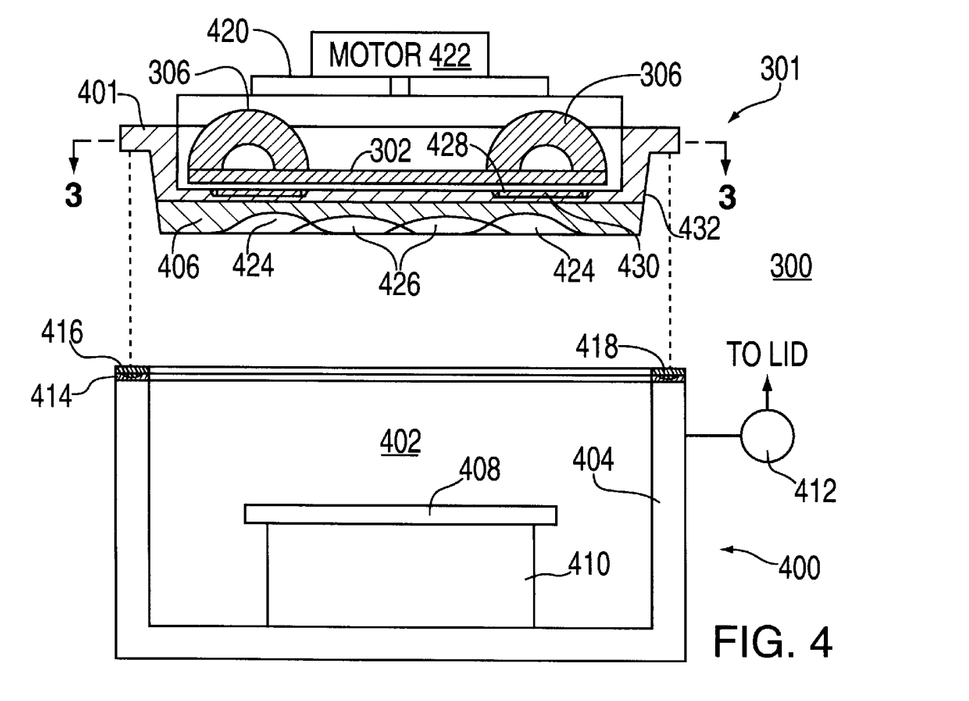
FIG. 4 depicts a schematic side cross-sectional view of a first embodiment of the present invention taken along line 4—4 of FIG. 3.

FIGS. 3 and 4 respectively illustrate a top cross-sectional view and a side cross-sectional view of a sputtering system 300 having a magnetron assembly 300 and vacuum chamber assembly 400. To best understand the invention, the reader should simultaneously refer to both FIGS. 3 and 4.

The sputtering system 300 includes a vacuum chamber 402 with in which a high vacuum is produced. Chamber 402 is typically enclosed by sidewalls 404 and a magnetron assembly 301 that also functions as a lid 401 for the vacuum chamber 402. The sidewalls 404 are often formed of a metal such as stainless steel or aluminum. Attached to the underside of the lid 401 is a target 406 formed of a material that is to be sputtered onto a wafer 408. In the bottom of chamber 402 is a pedestal 410 on which the wafer 408 is placed during processing. A voltage source 402 produces a DC or RF potential difference between walls 404 and lid 401 to accelerate ions into the target 406 to sputter target particles onto the wafer 408. A metal ring 414 is welded to the top of the sidewalls and includes a groove in which is inserted a rubber O-ring 416. This O-ring forms a vacuum seal between metal ring 414 and a ring 418 formed of a nonconductive material such as Teflon or a ceramic.

Nonconductive ring 418 enables the voltage difference to be produced between sidewalls 404 and lid 401. Because of the heat generated by the impact of high energy ions on the target, a coolant system, such as water-cooled chamber 420 (also serving as a mount for motor 422), is thermally connected to the target. To enhance cooling of the target, the lid is formed of a highly heat-conductive material such as copper.

In magnetron sputtering systems, a magnetic field is produced within chamber 402 adjacent to target 406 to increase the generation of ions near the target by trapping electrons near the target. These electron traps typically consist of one or more closed loop regions within which the magnetic field is substantially parallel to the target. In these regions, the electric field and magnetic field are substantially perpendicular and produce an $\overline{E} \times \overline{B}$ drift field that pushes electrons parallel to the surface of the target. Because these regions form closed loops or tunnels, the electrons become trapped near the target, thereby functioning effectively to produce ions that impact the target. In the sputtering system, magnetron assembly 300 produces these electron trap regions.

The magnetron assembly 301 includes pole pieces 302 and 304, a plurality of magnets 306, lid 401, target 406, and a water-cooled motor mount 420 that couples pole pieces 302 and 304 and associated magnets 306 to a motor 422. All of the magnets 306 have the same polarity magnetic pole overlying pole piece 302 e.g., the negative (N) pole of each magnet 306 contacts the pole piece 302 and the positive (P) pole of each magnet 306 contacts the pole piece 304. Although electromagnets can be used to produce a magnetic field between the pole pieces, permanent magnets are preferred because of their greater field strength.

The pole piece 302 is kidney shaped and pole piece 304 has an inner edge 308 that is substantially parallel to an outer edge 310 of pole piece 302 so that gap 312 between pole piece 302 and 304 is substantially constant. The constant gap 312 makes the magnetic field substantially constant throughout its length, thereby reducing the tendency of the plasma to form only near a portion of the gap between pole pieces 302 and 304.

Figure 5:
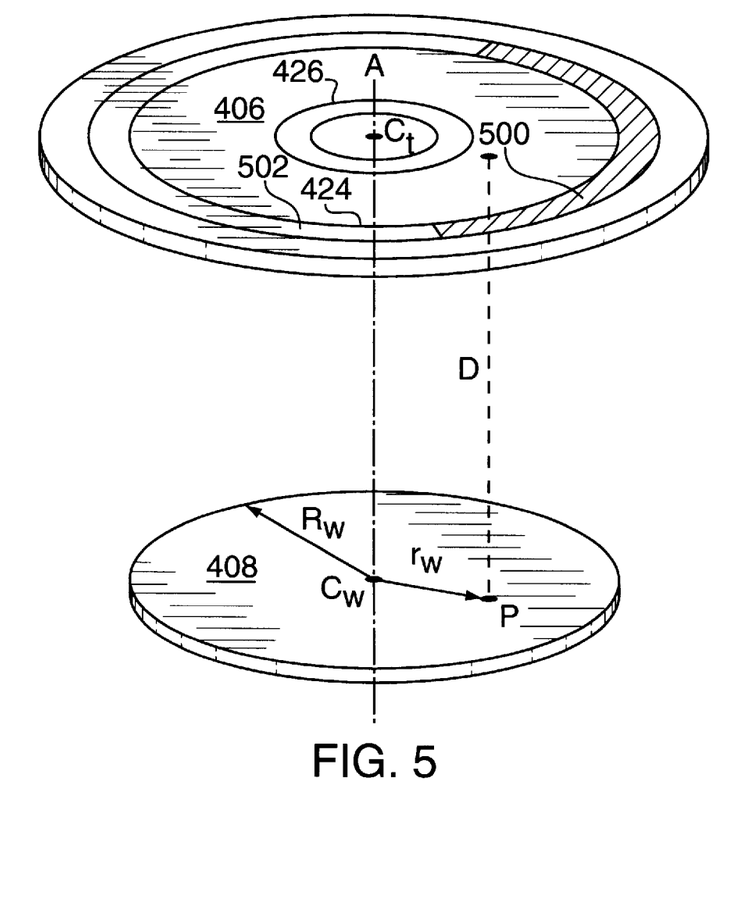
FIG. 5 illustrates target erosion relative to a semiconductor wafer.

Motor 422 rotates pole pieces 302 and 304 and magnets 306 about an axis A centered over wafer pedestal 410 to produce a time averaged sputtering that is circularly symmetric. As will be discussed in greater detail below, this rotation produces in target 406 circular sputtered grooves 424 and 426 that are centered on axis A. The width, depth and spacing of these grooves relative to axis A are chosen to produce very uniform coating thicknesses on wafer 408. Because groove 426 produces a large number of oblique ions onto the entire target and these ions have all possible lateral components (i.e., all possible vector components parallel to wafer 408), excellent step coverage results throughout the wafer for all orientations of steps. As seen from FIG. 5, the portion 500 of groove 424 produces a flux of ions having a radial component inward toward axis A. The portion 502 of groove 424 and all of groove 426 produce a flux of ions having a radial component outward from axis A. Because portion 500 of groove 424 is deeper and longer than groove 426, and is closer to points P than most of groove 426 and most of portion 502, the flux from portion 500 can be as large as from these other two sources. The radii of groove 426, groove 424, wafer 408 and target 406 are chosen in conjunction with the widths and depths of these grooves to produce substantially constant layer thickness and step coating uniformity over the entire wafer. Additionally, to moderate the pinching phenomenon in the deepest groove 424, the invention employs an annular magnetic soft shunt 428 shown in FIG. 4.

As shown in FIG. 4, the magnetic soft shunt 428 is embedded in an annular trough 430 in the backing plate 432 of the magnetic target 406. Generally, the shunt 428 is epoxied into the trough 430. The magnetic target material is deposited (bonded) upon the backing plate for deposition within the chamber 402. The shunt 428 is spaced from the target material by a distance of 0.5 mm to several millimeters (i.e., by the thickness of the backing plate at the bottom of the trough 430). As the target is eroded, most of the freed magnetic flux resulting from the thickness reduction at groove 424 is shunted through the magnetic shunt 428. Since the magnetic shunt is fabricated from a ferro-magnetic material, the shunt provides a path of least resistance for the excess magnetic flux. As such, the magnetic field directly above the target is not increased as the target erodes and the pinching phenomenon is eliminated. Preferably, the shunt 428 is placed just behind the deep erosion trench 424 that forms in the target material. Note that in this first embodiment of the invention the shunt of the present invention is generally not positioned between the pole pieces.

Figure 6:
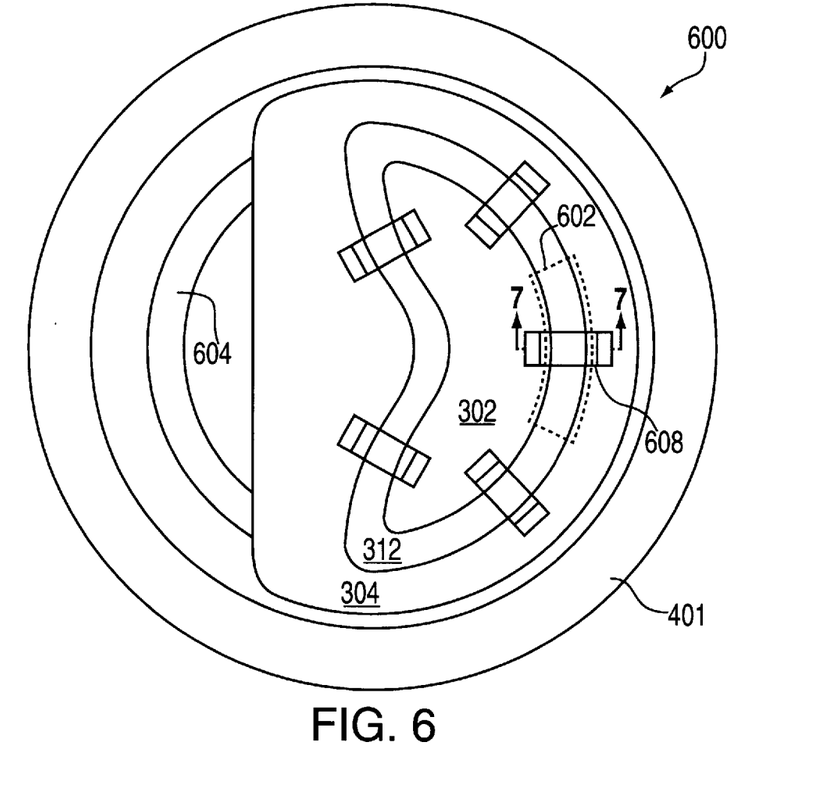
FIG. 6 depicts a top view of a second embodiment of the present invention.
Figure 7:
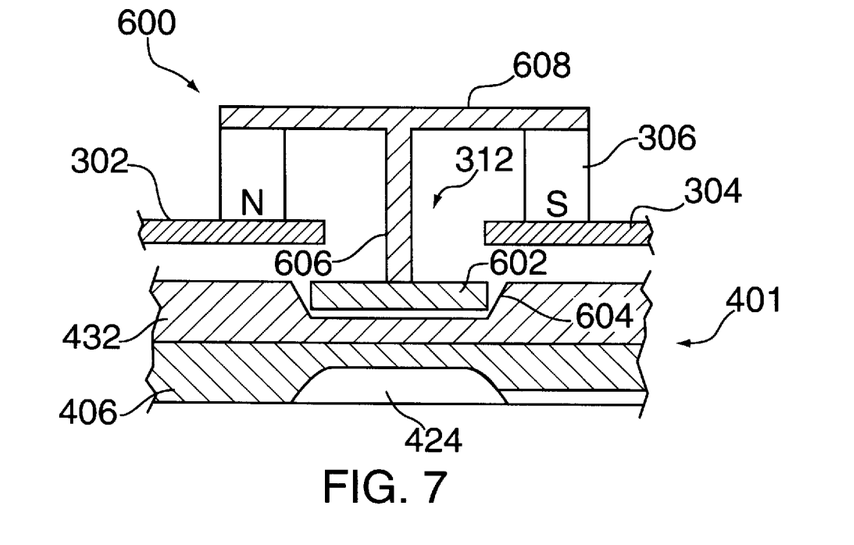
FIG. 7 depicts a cross-sectional view of a second embodiment of the present invention.

In the second embodiment of the invention depicted in FIG. 6, the magnetic shunt 602 is placed between the magnetic poles pieces 302 and 304 of the moving magnetic assembly 600. FIG. 7 depicts a cross-sectional view taken along lines 7—7 of FIG. 6. The reader will best understand the second embodiment of the invention by simultaneously referring to FIGS. 6 and 7.

The shunt 602 is positioned proximate the back of the target 401. To facilitate positioning the shunt near the target material, an annular trough 604 is formed into the backing plate 432 to allow the shunt 602 to move with the magnetic assembly and remain close to the back surface of the target. The shape of the magnetic assembly determines the erosion profile of the target. As such, in practical systems, varying shapes of magnetic assemblies are used. Consequently, the length and width of the shunt 602 varies with the design of the magnetic assembly. In the exemplary embodiment, a plurality of pairs of magnets 306 are respectively coupled to each pole piece 302 and 304. The magnets in each magnet pair are coupled to one another by a mounting plate 608. Centrally located along plate 608 is mounting extension 606 that is attached at its distal end to shunt 602. As such, the shunt 602 is located below the gap 312 between the pole pieces 302 and 304 along the portion of the assembly that produces the deep erosion trench 424. The shunt couples excess magnetic flux as the target erodes, thus eliminating the pinch phenomenon at trench 424.

Figure 8:
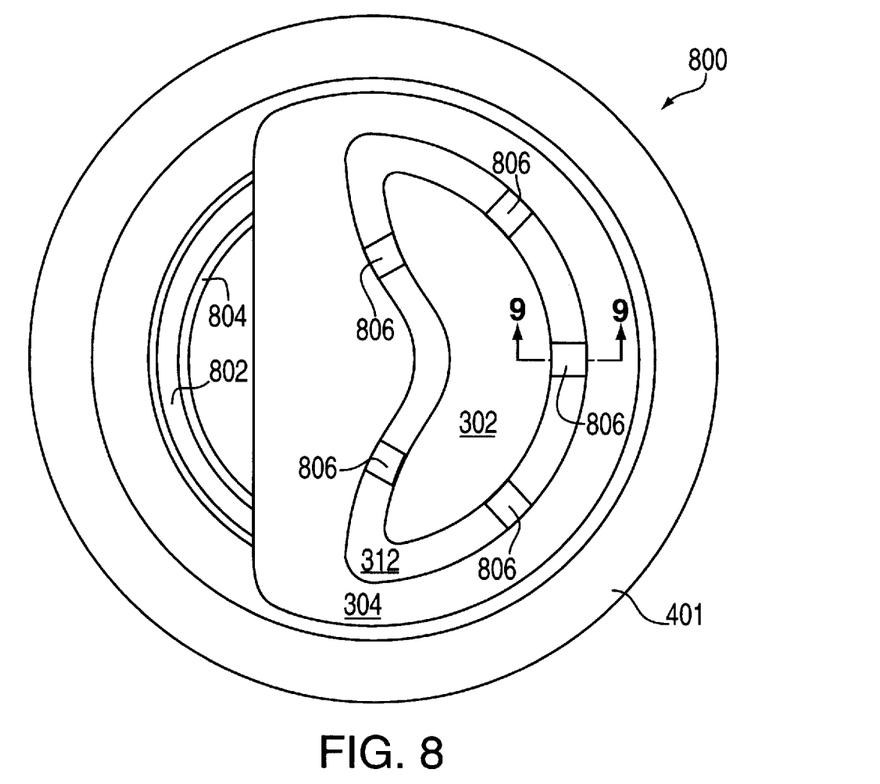
FIG. 8 depicts a top view of a third embodiment of the present invention.
Figure 9:
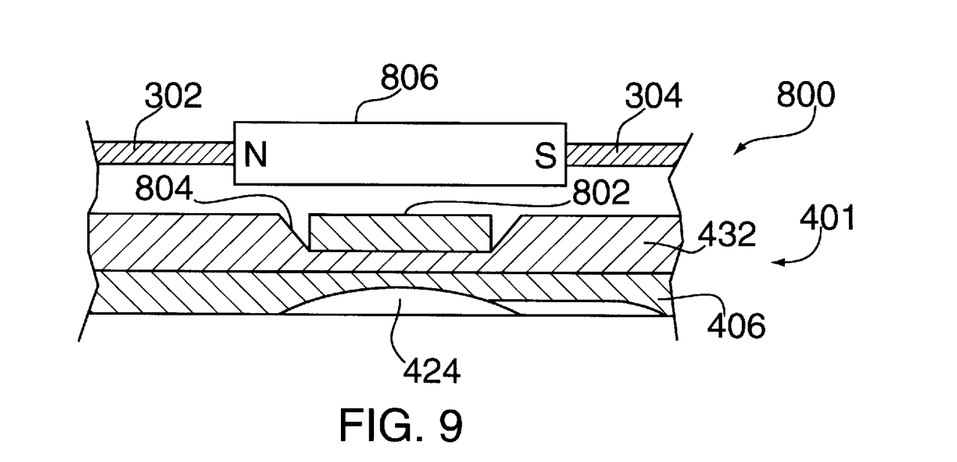
FIG. 9 depicts a cross-sectional view of a third embodiment of the present invention.

Specifically, FIG. 8 depicts a top plan view of the third embodiment and FIG. 9 depicts a cross-sectional view taken along line 9—9 of FIG. 8. In the third embodiment of the invention depicted in FIG. 8 and 9, the magnetic pole pieces 302 and 304 are arranged in a laterally-oriented magnetic assembly 800. In such an assembly 800, an annular shunt 802 is fixed to the bottom of an annular trough 804 cut into the backing plate 432 of the target 401. The shunt is placed in the annular trough 804 that is positioned over the deep erosion trench 424.

In each of the three embodiments of the invention, the shunt is located between the pole pieces and reduces (shunts) the magnetic field between the pole pieces at the target surface. However, the field strength of the magnetic fields at the surface of the target that lie outside the edges of the shunt may be relatively greater than the field strength of the field at the surface of the target near the center of the shunt. As such, to produce a more uniform magnetic field proximate the surface of the target, the magnetic pole pieces may be adapted to have a contoured magnetic field, e.g., a weaker field proximate the shunt edges and a stronger field proximate the shunt center. Consequently, the target is efficiently utilized and target sputtering is relatively uniform across the target surface.

Although various embodiments which incorporate the teachings of the present invention have been shown and described in detail herein, those skilled in the art can readily devise many other varied embodiments that still incorporate these teachings.

What is claimed is:

1. A sputtering system for sputtering particles from a magnetron-type target having a first surface and a second surface, where said particles are sputtered from said first surface, said sputtering system comprising a moving magnet assembly positioned adjacent to said second surface of the target and including a ferromagnetic pole piece assembly;

an actuator for moving the pole piece assembly parallel to the first surface of the target; and a magnetic shunt positioned between said second surface of said target, and said magnet assembly.

2. A sputtering system of claim 1 wherein said shunt is positioned in a trough formed in said second surface of said target.

3. A sputtering system of claim 2 wherein said trough and said shunt have an annular form.

4. A sputtering system of claim 1 wherein said magnetic shunt is positioned adjacent said second surface of said target at a location where a deepest sputter groove is expected to form in said first surface of said target during sputtering.

5. A sputtering system of claim 1 wherein said magnetic shunt is affixed to said moving magnet assembly.

6. A sputtering assembly of claim 5 wherein said moving magnet assembly comprises a pair of spaced-apart, coplanar pole pieces that define a gap therebetween, said magnetic shunt is aligned with said gap and positioned between the moving magnet assembly and the second surface of the target.

7. A sputtering assembly of claim 6 wherein said second surface of said target contains a trough within which the shunt moves as the moving magnet assembly moves.

8. A sputtering assembly of claim 1 wherein said moving magnet assembly comprises a pair of spaced-apart, coplanar pole pieces that define a gap therebetween and a magnet is positioned in within the gap, coplanar with said pole pieces.

9. A sputtering assembly of claim 1 wherein said ferromagnetic pole piece, assembly produces a magnetic field that is stronger proximate the center of the magnetic shunt and relatively weaker proximate an edge of the magnetic shunt.

10. A sputtering system for sputtering particles from a magnetron-type target having a first surface and a second surface, where said particles are sputtered from said first surface, said sputtering system comprising a moving magnet assembly positioned adjacent to said second surface of the target and including a ferromagnetic pole piece assembly;

an actuator for moving the pole piece assembly parallel to the first surface of the target; and a magnetic shunt, positioned in an annular trough formed in said second surface of said target, where said annular trough is located where a deepest sputter groove forms in said first surface of said target during sputtering.

11. The apparatus of claim 10 wherein the magnetic shunt is positioned within the annular trough.

12. The apparatus of claim 10 wherein the magnetic shunt is affixed to the moving magnet assembly and moves within the annular trough as the moving magnet assembly moves.

* * * * *